US010055522B2

(12) United States Patent
Behrend et al.

(10) Patent No.: US 10,055,522 B2
(45) Date of Patent: Aug. 21, 2018

(54) AUTOMATED CHECKER GENERATION

(71) Applicant: International Business Machines Corporation, Armonk, NY (US)

(72) Inventors: Joerg Behrend, Rangendingen (DE); Holger Horbach, Aidlingen (DE); Alexander Jung, Leinfelden-Echterdingen (DE); Klaus Keuerleber, Stuttgart (DE); Daniel D. Sentler, Steinenbronn (DE); Jurgen Wakunda, Ilsfeld (DE)

(73) Assignee: International Business Machines Corporation, Armonk, NY (US)

( * ) Notice: Subject to any disclaimer, the term of this patent is extended or adjusted under 35 U.S.C. 154(b) by 116 days.

(21) Appl. No.: 15/174,075

(22) Filed: Jun. 6, 2016

(65) Prior Publication Data

US 2017/0351788 A1    Dec. 7, 2017

(51) Int. Cl.
*G06F 17/50*      (2006.01)

(52) U.S. Cl.
CPC ................. *G06F 17/5009* (2013.01)

(58) Field of Classification Search
CPC ................................... G06F 17/5009
USPC ........................................ 716/107
See application file for complete search history.

(56) References Cited

U.S. PATENT DOCUMENTS

| | | | |
|---|---|---|---|
| 6,112,019 A * | 8/2000 | Chamdani ............ | G06F 9/3836 712/214 |
| 8,881,075 B2 | 11/2014 | Lu et al. | |
| 8,954,909 B2 | 2/2015 | Andraus et al. | |
| 9,195,789 B2 | 11/2015 | Mitra et al. | |
| 2005/0108596 A1 * | 5/2005 | Deaton ............... | G06F 11/2215 714/41 |
| 2014/0181768 A1 | 6/2014 | Yang et al. | |
| 2015/0269049 A1 | 9/2015 | Rohleder et al. | |
| 2016/0142280 A1 * | 5/2016 | Krishnamoorthy | G01R 31/31727 703/20 |

OTHER PUBLICATIONS

Kumar et al., "Functional Verification of Register using UVM RAL Methodology", International Journal of Latest Trends in Engineering, Science and Technology, vol. 1, Issue 5, IJLTEST—vol. I, Issue 5 (May-Jun. 2014), 5 pages.

(Continued)

*Primary Examiner* — Suchin Parihar
(74) *Attorney, Agent, or Firm* — Gilbert Harmon, Jr.

(57) ABSTRACT

The invention relates to a method for verifying a design of an electronic circuit. The electronic circuit comprises at least one register including one or more parts. After receiving specification information of said register, a register monitor module is automatically created based on said received specification information. The register monitor module comprises a scoreboard for each part of the register. Said scoreboard comprises an expected data value queue for receiving expected data values, an actual data value queue for receiving actual data values. Furthermore, the register monitor module provides a matching strategy for comparing expected data values with actual data values. Expected data values and actual data values are compared for each scoreboard based on the matching strategy and an error indication is generated if the result of the comparison step does not fulfill the requirements specified in the matching strategy.

20 Claims, 4 Drawing Sheets

(56) References Cited

OTHER PUBLICATIONS

Soto et al., "SystemC/TLM flow for SoC Design and Verification", 2015 Argentine School of Micro-Nanoelectronics, Technology and Applications, ISBN: 978-1-4799-8017-8, IEEE Catalog No. CFP 1554E-CDR, 6 pages.

* cited by examiner

```
#prefix CC_ATOMIC_LOCK_REG {

Width = 16                                                    220
210
    DialName = "TCEC00.CORE.CC_ATOMIC_LOCK_REG";

Lashift = 48;
                            230
    AddressInfo = {
        { SCOM, 0x200303ff }
    };

240 PartInfo = {
        { CC_ATOMIC_LOCK_ENABLE, 1, "0, 0" }
        { CC_ATOMIC_ID,          4, "1, 4" }
        { CC_ATOMIC_ACTIVITY,    8, "8, 15" }
    };            241              242
}
```

AUTOMATED CHECKER GENERATION

BACKGROUND OF THE INVENTION

The present invention relates to the field of electronic circuit verification. More specifically, the present document relates to a method for verifying the design of an electronic circuit by means of an automatically generated register monitor module.

SUMMARY

In one aspect, a computer-implemented method for verifying a design of an electronic circuit including a register is provided. The method comprises receiving specification information of a register, said specification information comprising information regarding the parts included in the register, automatically generating a register monitor module based on said received specification information, said register monitor module comprising a scoreboard for each part of the register, said scoreboard comprising an expected data value queue for receiving expected data values which are expected to be included in the respective part of the register and an actual data value queue for receiving actual data values actually included in the respective part of the register, the register monitor module further including a matching strategy for comparing expected data values with actual data values, calculating expected data values using a reference model of the electronic circuit and providing said expected data values to the expected data value queue of the respective scoreboard, calculating actual data values using a simulation environment simulating the electronic circuit and providing said actual data values to the actual data value queue of the respective scoreboard, comparing, for each scoreboard, the values of the expected data value queue with the values of the actual data value queue based on the matching strategy; and generating an error indication if the result of the comparison step does not fulfil the requirements specified in the matching strategy.

According to a further aspect, a computer system for verifying a design of an electronic circuit including a register is provided. Said computer system comprises: an input interface for receiving specification information of a register, said specification information comprising information regarding the parts included in the register, a generation module being configured to automatically generate a register monitor module based on said received specification information, said register monitor module comprising a scoreboard for each part of the register, said scoreboard comprising an expected data value queue for receiving expected data values which are expected to be included in the respective part of the register, an actual data value queue for receiving actual data values actually included in the respective part of the register, the register monitor module further including a matching strategy for comparing expected data values with actual data values, a unit monitor module configured to calculate expected data values using a reference model of the electronic circuit and to provide said expected data values to the expected data value queue of the respective scoreboard, a simulation module configured to calculate actual data values by simulating the electronic circuit and providing said actual data values to the actual data value queue of the respective scoreboard, a comparator module configured to compare, for each scoreboard, the values of the expected data value queue with the values of the actual data value queue based on the matching strategy, and an output interface for providing an error indication if the result provided by the comparator does not fulfil the requirements specified in the matching strategy.

According to a further aspect, a computer program product for verifying a design of an electronic circuit including a register is provided. The computer program product comprises a computer readable storage medium having program instructions embodied therewith, the program instructions executable by a processor to cause the processor to execute a method according to the above-mentioned aspect.

BRIEF DESCRIPTION OF THE SEVERAL VIEWS OF THE DRAWINGS

In the following, embodiments of the invention are explained in greater detail, by way of example only, making reference to the drawings in which:

FIG. 3 illustrates an extracted set of data used for automatically generating the register monitor module.

DETAILED DESCRIPTION

Figure 1:
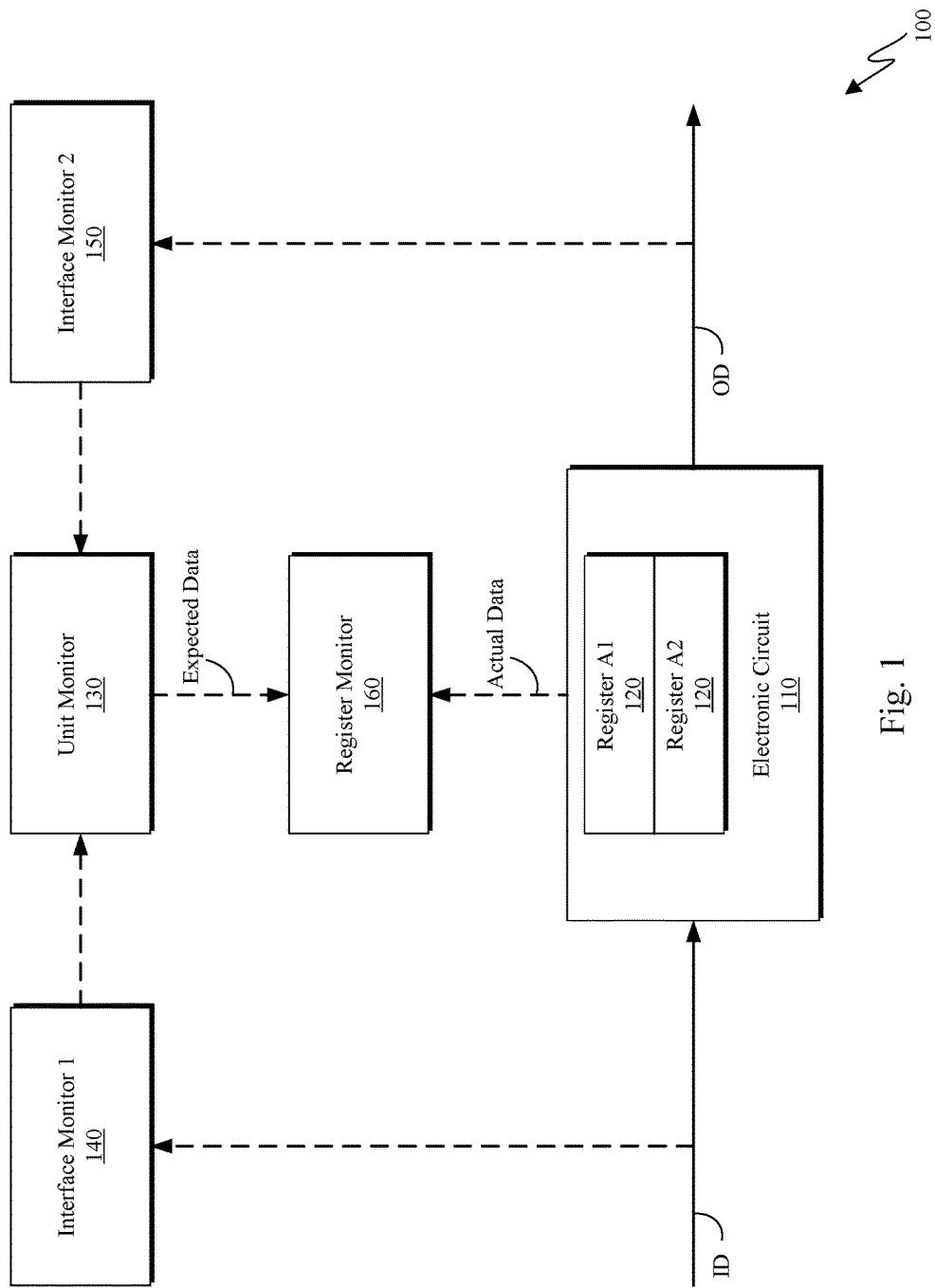
FIG. 1 schematically illustrates a schematic block diagram of a system for verifying the functionality of an electronic circuit.

The present invention may also include the following example features:

According to an example embodiment of the verification method, certain specification values are extracted from said specification information and the register monitor module is adaptively generated based on said extracted specification values. For example, information regarding the number of parts included in the register and information regarding the size of the respective parts may be extracted. The number of scoreboards included in the register monitor module may be chosen according to said extracted number of parts. Thereby, the register monitor module can be automatically configured to the respective register configuration.

According to example embodiments of the verification method, the register monitor module is generated including a number of scoreboards equal to the number of parts included in the register. Thereby, by means of a respective scoreboard, changes within a certain part of the register can be handled independent of changes occurring in further parts. Thus, an improved and independent change detection is obtained.

According to example embodiments of the verification method, each scoreboard is associated with a scoreboard-inherent matching strategy and the comparison of actual data values with expected data values and the generation of an error indication are based on said scoreboard-inherent matching strategy. In other words, different scoreboards may use different matching strategies. Thereby it is possible to define the rules for comparing the actual data values with expected data values individually for each part of the register.

According to example embodiments of the verification method, the matching strategy is a customizable matching strategy indicating the matching requirements to be fulfilled when comparing values of the expected data value queue with values of the actual data value queue. For example, the matching strategy may request a one-to-one matching between actual data values and expected data values. Alternatively, the matching strategy may request a weaker matching strategy, e.g. allowing an out-of-order occurrence of actual data values and expected data values. Thereby, the matching can be adapted part-wise according to the required needs.

According to example embodiments of the verification method, the expected data values are provided by a unit monitor module, said unit monitor module receiving information regarding the input data and output data of the simulation environment of the electronic circuit and providing expected data values based on the reference model of the simulated electronic circuit and said input data and output data. The unit monitor module may include the reference model of the electronic circuit. By separating the calculation of the expected data values from the register monitor module, a decoupling between providing expected data values (performed in the unit monitor module) and detecting changes/comparing values (performed in the register monitor module) is obtained.

According to example embodiments of the verification method, the simulation environment of the electronic circuit provides actual data values of a certain part of the register to the scoreboard associated with said part. Similarly, the unit monitor module provides expected data values of a certain part of the register to the scoreboard associated with said part. Thereby, each scoreboard performs change detection only for a certain part of the register. Thus, independent change detection for each part of the register is obtained which improves the efficiency of the verification environment.

According to example embodiments of the verification method, the register monitor module detects changes of actual data values within a part of the register and provides said changed actual data values to the scoreboard associated with said part of the register.

According to example embodiments of the computer system, the computer system comprises extraction means for extracting certain specification values from said specification information, wherein the generation module is configured to adaptively generate said register monitor module based on said extracted specification values. For example, information regarding the number of parts included in the register and information regarding the size of the respective parts may be extracted. The number of scoreboards included in the register monitor module may be chosen according to said extracted number of parts. Thereby, the register monitor module can be automatically configured to the respective register configuration.

According to example embodiments of the computer system, the generation module is configured to provide a register monitor module including a plurality of scoreboards, the number of scoreboards being equal to the extracted number of parts included in the register. Thereby, by means of a respective scoreboard, changes within a certain part of the register can be handled independent of changes occurring in further parts. Thus, improved and independent change detection is obtained.

According to example embodiments of the computer system, the unit monitor module is configured to receive information regarding the input data and output data of the simulated electronic circuit and configured to calculate expected data values based on the reference model of the simulated electronic circuit and said input data and output data. By separating the calculation of the expected data values from the register monitor module, a decoupling between providing expected data values (performed in the unit monitor module) and detecting changes/comparing values (performed in the register monitor module) is obtained.

According to example embodiments of the computer system, each scoreboard is associated with a scoreboard-inherent matching strategy and the comparison of actual data values with expected data values and the generation of an error indication is based said scoreboard-inherent matching strategy. In other words, different scoreboards may use different matching strategies. Thereby it is possible to define the rules for comparing the actual data values with expected data values individually for each part of the register.

It will be understood that the term "scoreboard", when used in this specification, specifies means for a collecting and comparing data. Said comparing may be done based on a global matching strategy or a scoreboard-inherent matching strategy.

It will be understood that the terms "module" or "interface", when used in this specification, specify hardware or software entities or interfaces.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 illustrates a schematic block diagram of a computer-implemented system 100 for verifying a design of an electronic circuit 110. Said electronic circuit 110 may not be a physical hardware device checked by the system 100 but the electronic circuit 110 may be simulated within a simulation environment, said simulation environment comprising a model of the hardware of the electronic circuit 110. Based on said simulation environment, input data ID can be provided to the electronic circuit 110, said input data ID causing the electronic circuit 110 to change one or more of its internal states. In addition, the output data OD provided at an output of the electronic circuit 110 may also change.

Specifically, the electronic circuit 110 may include one or more registers 120, in the present embodiment, the registers A1 and A2. Each register 120 may include one or more parts. Each part may comprise a certain bits width, i.e. each part may span over one or more bits. Each part of the register 120 may be used to store certain information, i.e. the bits included in a respective part carry certain information. Each register 120 may include actual data which are calculated by the simulation environment while running the simulation based on the current state of the register 120, the input data ID and/or the output data OD. The simulation may be performed in multiple cycles, wherein in each cycle one or more bits are provided as an input to the electronic circuit 110 and processed accordingly. Thereby, changes of the current state of the register 120 occur. The current state of the register 120, respectively the current state of parts of the register 120 is reflected by actual data values currently included in the register 120.

In order to be able to verify the functionality of the design of the electronic circuit 110, a unit monitor module 130 is provided. Said unit monitor module 130 comprises a reference model of the electronic circuit 110, which rebuilds the functionality of the electronic circuit 110 in order to create a reference based on which a verification of the electronic circuit 110 is possible, i.e. based on the reference model it is possible to determine whether the electronic circuit 110 behaves according to its specifications. The reference model included in the unit monitor module 130 is usually a hand-coded software model of the register 120. The reference model may comprise means for storing the incoming information regarding the input data ID and/or storing changes of the register for some cycles.

The unit monitor module 130 may be coupled with the input of the electronic circuit 110 via a first interface monitor 140 and may be coupled with the output of the electronic circuit 110 via a second interface monitor 150. The unit monitor module 130 receives information regarding the input data ID from said first interface monitor 140 and information regarding the output data OD from said second interface monitor 150. For example, said interface monitors 140, 150 may be configured to process the input data/output data in order to provide a required data format to the unit monitor module 130. Based on said received information regarding the input data ID and regarding the output data OD and based on the current state of the register 120, the unit monitor module 130 is able to provide expected data values. In other words, based on the reference model included in the unit monitor module 130 and the received input data ID and output data OD, the unit monitor module 130 calculates data expected to be included in the register 120.

In the present embodiment, the unit monitor module 130 does not receive directly said actual data values of the register 120 but the actual data are provided to a register monitor module 160. Said register monitor module 160 also receives the expected data values provided by the unit monitor module 130. In other words, the register monitor module 160 is coupled with the unit monitor module 130 and the register monitor module 160 in order to receive expected data values and actual data values. The register monitor module 160 is configured to compare the actual data values with the expected data values in order to decide if there is a mismatch between the actual data values and the expected data values.

By separating the calculation of the expected data values (by means of the reference model included in the unit monitor module 130) from checking of mismatches between actual data values and the expected data values and evaluating said mismatches (included in the register monitor module 160), a clear separation between calculating expected data values and checking of mismatches between actual data values and the expected data values is obtained.

In contrary to the unit monitor module 130 which may be a hand-coded part of software, the register monitor module 160 is automatically generated. Specifically, the register monitor module 160 is automatically generated based on register specification information. Said register specification information may include, for example, information regarding the width of the register 120, the parts included in the register 120 and the bit width of the respective parts of the register 120 etc. Based on said information, the register monitor module 160 may be automatically generated, e.g. based on a software routine.

Figure 2:
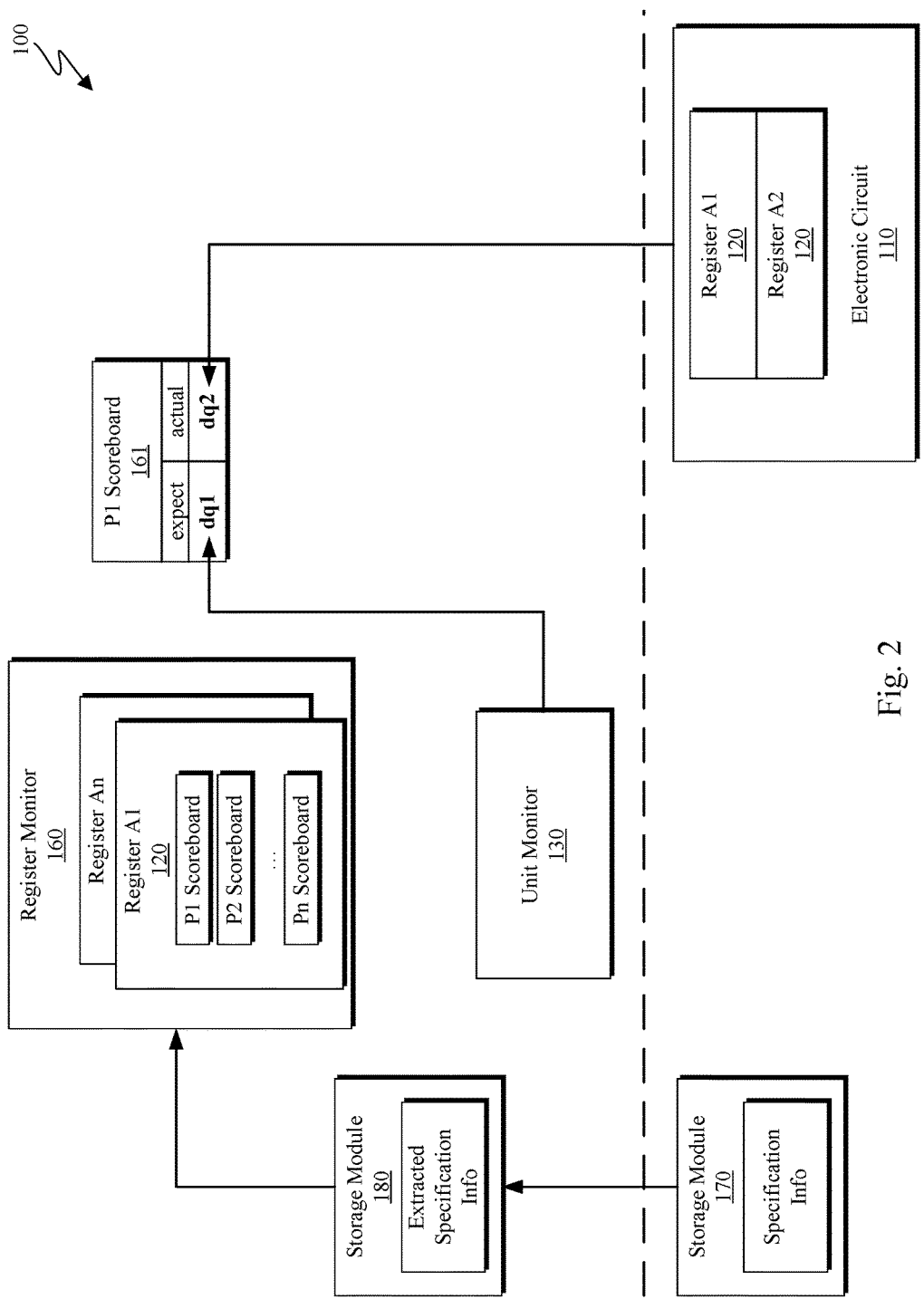
FIG. 2 illustrates interaction of parts of the verification system with a simulation environment for simulating the electronic circuit based on a schematic block diagram.

FIG. 2 illustrates the generation of the register monitor module 160, the structure of the register monitor module 160 and the interaction of the register monitor module 160 with the electronic circuit 110 including the register 120 in closer detail. Specification information providing technical details of the register 120 may be stored in a storage module 170. As mentioned before, specification information may include information regarding the width of the register 120, the parts included in the register 120 and the bit width of the respective parts of the register 120. For automatic generation of the register monitor 160, said specification information may be preprocessed. For example, certain information may be extracted from said specification information, e.g. register width information, number of register parts, bit width of the register parts etc. Said information may be extracted right before the automatic generation of the register monitor 160 or may be extracted in advance. For example, the extracted data may be stored in a storage module 180 which may be the same storage module that stores the specification information or may be a different storage module.

After automatic generation of the register monitor module 160, the register monitor module 160 may include at least one scoreboard 161 for the register 120 included in the electronic circuit 110. In case that the electronic circuit 110 includes multiple registers 120, the register monitor module 160 may include multiple scoreboards 161 associated with the respective registers 120. In case that a certain register 120 comprises multiple parts P1-Pn, one scoreboard 161 is provided for each part of the register 120. In other words, each register 120 is associated with a set of scoreboards 161 wherein the number of scoreboards 161 depends on the number of parts (P1-Pn; n=1, 2, 3, . . . ) included in the register 120. Thereby, each scoreboard 160 is able to handle changes of data values included in the respective part of the register 120 independent of the other parts of the register 120.

Each scoreboard 161 is configured to receive expected data values as well as actual data values, said values being associated with the part of the register 120, the scoreboard 161 belongs to. Specifically, the scoreboard 161 may comprise two data queues dq1, dq2, the first data queue dq1 being configured to receive one or more expected data values and the second data queue dq2 being configured to receive actual data values. Said data queues dq1, dq2 may be configured to store multiple consecutive data values in order to be able to implement multiple matching strategies, i.e. not only a bitwise comparison (identical, not identical) is possible but also a long-term comparison over multiple cycles is possible (e.g. comparison regarding the order of bits of expected data values and actual data values). The first data queue dq1 may receive expected data values consecutively, wherein a certain data value is provided to the scoreboard 161 of the register monitor module 160 when the reference model included in the unit monitor module 130 has calculated a new data value. Similarly, the second data queue dq2 may receive actual data values consecutively, wherein a certain data value is provided to the scoreboard 161 of the register monitor module 160 when the simulation environment simulating the electronic device 110 indicates that the current value of the register 120 has changed.

The register monitor module 160 may be configured to provide multiple matching strategies based on which the comparison of actual and expected data values is performed. For example, an "in order"-matching strategy, an "out of order"-matching strategy, a weak matching strategy or a fuzzy matching strategy may be provided. The "in order"-matching strategy may define that actual data values and expected data values have to be provided in the same order, whereas the "out of order"-matching strategy defines that the data values can be provided in an arbitrary order. A "fuzzy"-matching strategy may allow a certain deviation of actual data values from expected data values. Said deviation can be defined by using a deviation value. For example, in a strict comparison scenario, an actual data value of "35" and an expected data value of "36" may lead to an error whereas using a "fuzzy"-matching strategy with a tolerable deviation of ±1 may lead to a guilty match. A "fuzzy"-matching strategy may be used, for example, in cases in which an exact prediction of a data value is not possible or only with an unreasonable effort. Finally, a "weak"-matching strategy may allow comparing actual data values and expected data values which have a loose temporal coupling. For example, an expected data value may be received at a certain point of time but no actual data value is received. In such a case, the monitored register still comprises a certain data value. In that case, the received expected data value is compared with the actual data value included in the register. If said values match, a "weak match" is detected and the expected data value remains in the scoreboard. If an actual data value is received later on which matches with the received expected data value, the "weak match" is changed into a "standard match". Otherwise (no actual data value is received or a non-matching actual data value is received), the detected "weak match" does not lead to an error indication.

According to embodiments, each scoreboard 161 may be associated with its own matching strategy, i.e. the different scoreboards 161 may use different matching strategies for comparing actual data values and expected data values. Thus, different parts of the register 120 can be covered with different matching strategies, i.e. a first part which may comprise data highly sensitive for the functionality of the electronic circuit can be driven with an "in order"-matching strategy whereas a further part of the register 120 which may comprise less sensitive data may be driven with a weak matching strategy.

As mentioned before, the actual data values and the expected data values are provided to the respective scoreboards 161 of the register monitor module 160. The register monitor module 160 may be adapted to compare the actual data values and the expected data values included in the respective scoreboard 161 based on the matching strategy in order to decide whether the simulated electronic circuit shows functionality as expected. If a matching according to the matching strategy is detected, the data values may be removed from said data queues. If no matching is observed, an error indication may be generated and provided at an output interface. Depending on the matching strategy, it is also possible to compare the actual data values and the expected data values only at the end of the verification process.

FIG. 3 shows an example embodiment of a set of parameter 200 defining a certain kind of register 120. Said set of parameter may be used as an input for automatically generating the register monitor module 160. The set of parameter 200 may, for example, comprise the width 210 of the register, a name 220 for accessing the simulation model of said register, address information 230 of the register, and parts information 240 of parts included in the register. Said parts information 240 may for example include a name 241 for each part and part dimensions 242 (bit width, bit numbers) in order to extract data. By means of said set of parameter 200 it is possible to automatically create the register monitor module 160 (number of registers, number of parts per register etc.) and instruct the register monitor module 160 how to detect changes of the register, where to store said changes and how to compare received actual and expected data values.

Figure 4:
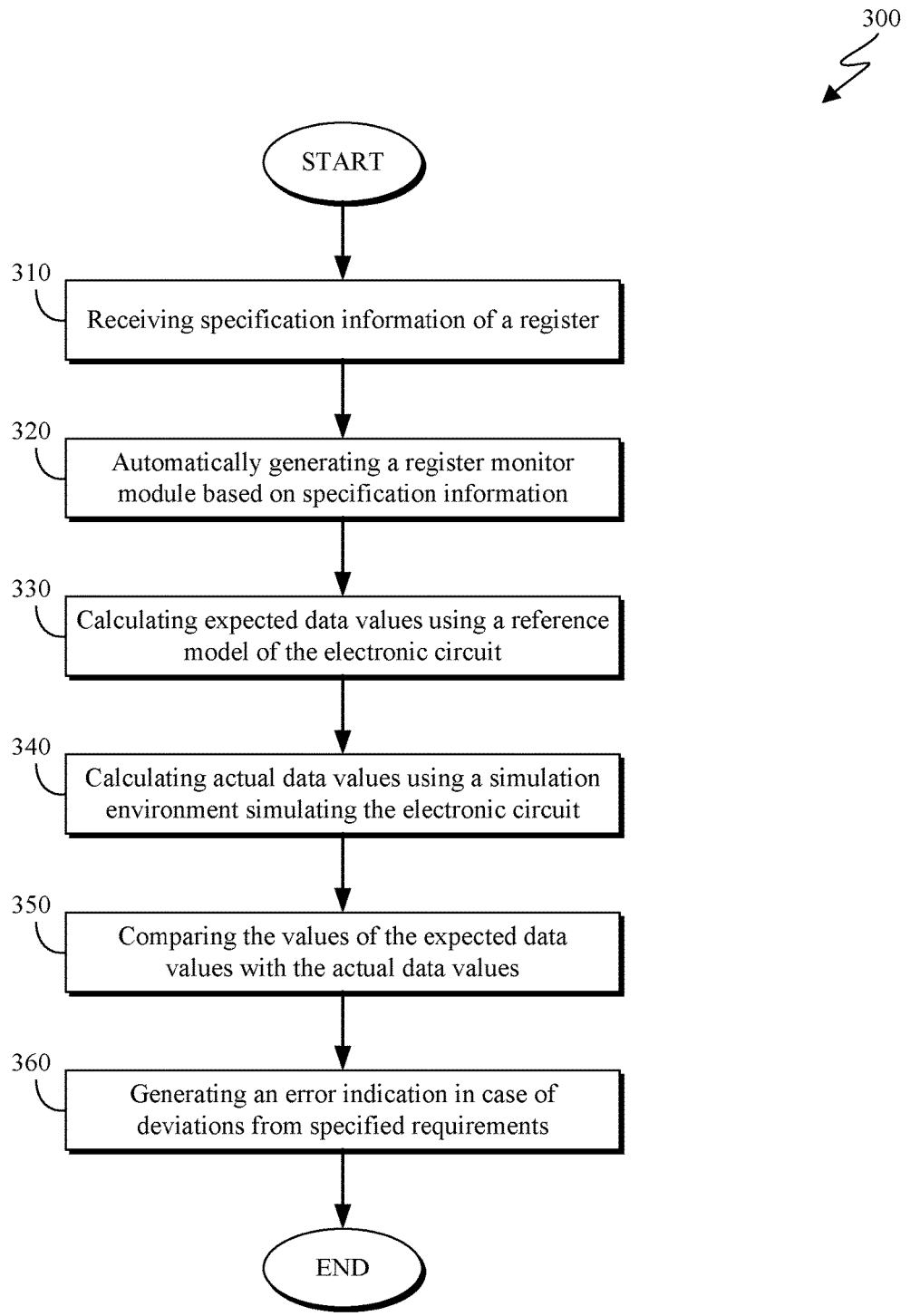
FIG. 4 illustrates a method for verifying the functionality of an electronic circuit based on a flow chart.

FIG. 4 shows a flow chart of a computer-implemented method 300 for verifying the design of an electronic circuit 120 comprising a register 120. First, specification information of a register included in the electronic circuit is received (S310). Said specification information may include technical details of the register, e.g. width of the register, parts included in the register, bit width of the respective parts etc.

After receiving said specification information, the register monitor module is automatically generated based on the received specification information (S310). Specifically, the register monitor module may be created by a software routine by considering technical details of the register. For example, the specification information may include multiple parts and the register monitor module may be configured with multiple scoreboards wherein the number of parts and the number of scoreboards is identical, i.e. each part is associated with its own scoreboard.

After creating the register monitor module the verification process is executed. For example, expected data values are calculated (S330). Said calculation may be performed using a reference model of the electronic circuit. Said reference model may be a hand-coded model replicating the electronic circuit. Said reference model may be written by a verification engineer in order to provide a reference for verifying the electronic circuit before manufacturing the electronic circuit.

In addition, actual data values may be calculated (S340). Said actual data values may be calculated by a simulation environment adapted to simulate a hardware model of the electronic circuit. The actual data values may result from input data provided to the input of the electronic circuit and the current state of the electronic circuit, specifically the current state of one or more registers included in the electronic circuit.

Said current data values and expected data values may be received at the register monitor module, specifically at the respective scoreboard which is associated with the part of register to which the actual and current data values belong to. Based on said register monitor module, the expected data values are compared with the actual data values (S350). Said comparison is based on the respective matching strategy, specifically, the matching strategy defined for the respective scoreboard.

In case that the comparison result corresponds to the matching strategy, the verification is passed. In case of deviations from requirements indicated by the matching strategy, an error indication is generated (S360), said error indication specifying that an impermissible deviation between current data values and expected data values occurred.

Summing up, an electronic circuit verification method has been presented which uses an automatically generated register monitor unit. Said method is advantageous because the tasks of computing the expected data values and change detection/comparison are performed by separated entities, namely the unit monitor module and the register monitor module. The unit monitor module may be a hand-coded module including the reference model whereas the register monitor module is automatically generated by a software routine. So, in other words, the tasks of generating expected data values and checking the match of actual data values with expected data values is separated. Furthermore, due to the automatic generation of the register monitor unit, the costs for creating a verification environment are significantly reduced because no manual creation of software routines for change detection, storing shifting of data values and comparing actual data values with expected data values is necessary. Finally, a higher flexibility in timing between calculating expected data values and changes of actual data values is achieved.

The invention claimed is:

1. A computer-implemented method for verifying a design of an electronic circuit including a register, the method comprising:
receiving specification information of a register, said specification information comprising information regarding the parts included in the register;
automatically generating a register monitor module based on said received specification information, said register monitor module comprising a scoreboard for each part of the register, said scoreboard comprising an expected data value queue for receiving expected data values which are expected to be included in the respective part of the register and an actual data value queue for receiving actual data values actually included in the respective part of the register, the register monitor module further including a matching strategy for comparing expected data values with actual data values;

detecting a change to the register;

responsive to detecting a change to the register, calculating one or more actual data values using a simulation environment simulating the electronic circuit and providing said one or more actual data values to the actual data value queue of the respective scoreboard;

calculating one or more expected data values corresponding to the one or more actual data values using a reference model of the electronic circuit and providing said expected data values to the expected data value queue of the respective scoreboard;

comparing, for the respective scoreboard, a first actual data value from the actual data value queue to a first expected data value from the expected data value queue according to the matching strategy to determine whether the first actual data value and the first expected data value match;

responsive to determining that the first actual data value and the first expected data value match, removing the first actual data value from the actual data value queue and removing the first expected data value from the expected data value queue; and responsive to determining that the result of the comparison step does not fulfill the requirements specified in the matching strategy, generating an error indication.

2. The computer-implemented method according to claim 1, wherein certain specification values are extracted from said specification information and the register monitor module is adaptively generated based on said extracted specification values.

3. The computer-implemented method according to claim 2, wherein information regarding the number of parts included in the register and information regarding the size of the respective parts is extracted.

4. The computer-implemented method according to claim 1, wherein the register monitor module is generated including a number of scoreboards equal to the number of parts included in the register.

5. The computer-implemented method according to claim 1, wherein each scoreboard is associated with a scoreboard-inherent matching strategy and the comparison of actual data values with expected data values and the generation of an error indication are based on said scoreboard-inherent matching strategy.

6. The computer-implemented method according to claim 1, wherein the matching strategy is a customizable matching strategy indicating the matching requirements to be fulfilled when comparing values of the expected data value queue with values of the actual data value queue.

7. The computer-implemented method according to claim 1, wherein expected data values are provided by a unit monitor module, said unit monitor module receiving information regarding the input data and output data of the simulation environment of the electronic circuit and providing expected data values based on the reference model of the simulated electronic circuit and said input data and output data.

8. The computer-implemented method according to claim 1, wherein the simulation environment of the electronic circuit provides actual data values of a part of the register to the scoreboard associated with said part.

9. The computer-implemented method according to claim 1, wherein the register monitor module detects changes of actual data values within a part of the register and provides said changed actual data values to the scoreboard associated with said part of the register.

10. A computer system for verifying a design of an electronic circuit including a register, the system comprising:

an input interface for receiving specification information of a register, said specification information comprising information regarding the parts included in the register;

a generation module being adapted to automatically generate a register monitor module based on said received specification information, said register monitor module comprising a scoreboard for each part of the register, said scoreboard comprising an expected data value queue for receiving expected data values which are expected to be included in the respective part of the register, an actual data value queue for receiving actual data values actually included in the respective part of the register, the register monitor module further including a matching strategy for comparing expected data values with actual data values;

a unit monitor module configured to detect a change to the register and to, responsive to detecting a change to the register, calculate expected data values using a reference model of the electronic circuit and to provide said expected data values to the expected data value queue of the respective scoreboard;

a simulation module configured to, responsive to detecting a change to the register, calculate one or more actual data values by simulating the electronic circuit and providing said one or more actual data values to the actual data value queue of the respective scoreboard;

a comparator module configured to compare, for the respective scoreboard, a first actual data value from the actual data value queue to a first expected data value from the expected data value queue according to the matching strategy to determine whether the first actual data value and the first expected data value match based on the matching strategy; and an output interface for providing an error indication if the result provided by the comparator does not fulfil the requirements specified in the matching strategy and to remove the first actual data value from the actual data value queue and remove the first expected data value from the expected data value queue if the first actual data value and the first expected data value match.

11. The computer system according to claim 10, comprising extraction means for extracting certain specification values from said specification information, wherein the generation module is configured to adaptively generate said register monitor module based on said extracted specification values.

12. The computer system according to claim 11, wherein said extraction means are configured to extract information regarding the number of parts included in the register and information regarding the size of the respective parts.

13. The computer system according to claim 12, wherein said generation module is configured to provide a register monitor module including a plurality of scoreboards, the number of scoreboards being equal to the extracted number of parts included in the register.

14. The computer system according to claim 10, wherein the unit monitor module is configured to receive information regarding the input data and output data of the simulated electronic circuit and configured to calculate expected data values based on the reference model of the simulated electronic circuit and said input data and output data.

15. The computer system according to claim 10, wherein each scoreboard is associated with a scoreboard-inherent matching strategy and the comparison of actual data values with expected data values and the generation of an error indication is based said scoreboard-inherent matching strategy.

16. A computer program product comprising:
one or more computer readable storage media and program instructions stored on the one or more computer readable storage media, the program instructions comprising instructions to:
receive specification information of a register, said specification information comprising information regarding the parts included in the register;
automatically generate a register monitor module based on said received specification information, said register monitor module comprising a scoreboard for each part of the register, said scoreboard comprising an expected data value queue for receiving expected data values which are expected to be included in the respective part of the register and an actual data value queue for receiving actual data values actually included in the respective part of the register, the register monitor module further including a matching strategy for comparing expected data values with actual data values;
detect a change to the register;
responsive to detecting a change to the register, calculate one or more actual data values using a simulation environment simulating the electronic circuit and providing said one or more actual data values to the actual data value queue of the respective scoreboard;
calculate one or more expected data values corresponding to the one or more actual data values using a reference model of the electronic circuit and provide said expected data values to the expected data value queue of the respective scoreboard;
compare, for the respective scoreboard, a first actual data value from the actual data value queue to a first expected data value from the expected data value queue according to the matching strategy to determine whether the first actual data value and the first expected data value match;
responsive to determining that the first actual data value and the first expected data value match, removing the first actual data value from the actual data value queue and removing the first expected data value from the expected data value queue; and
responsive to determining that the result of the comparison step does not fulfill the requirements specified in the matching strategy, generate an error indication.

17. The computer program product according to claim 16, wherein certain specification values are extracted from said specification information and the register monitor module is adaptively generated based on said extracted specification values.

18. The computer program product according to claim 17, wherein information regarding the number of parts included in the register and information regarding the size of the respective parts is extracted.

19. The computer program product according to claim 16, wherein the register monitor module is generated including a number of scoreboards equal to the number of parts included in the register.

20. The computer program product according to claim 16, wherein each scoreboard is associated with a scoreboard-inherent matching strategy and the comparison of actual data values with expected data values and the generation of an error indication are based on said scoreboard-inherent matching strategy.

* * * * *